United States Patent [19]
Mizutani et al.

[11] Patent Number: 5,101,253
[45] Date of Patent: Mar. 31, 1992

[54] PHOTO SENSOR WITH MONOLITHIC DIFFERENTIAL AMPLIFIER

[75] Inventors: Hidemasa Mizutani, Sagamihara; Jun Nakayama, Atsugi; Masaru Nakayama, Atsugi; Ken Yamaguchi, Atsugi; Kazuhiko Muto, Kawasaki; Yasuteru Ichida, Machida, all of Japan

[73] Assignee: Canon Kabushiki Kaisha, Japan

[21] Appl. No.: 713,607

[22] Filed: Jun. 11, 1991

Related U.S. Application Data

[63] Continuation of Ser. No. 590,492, Oct. 1, 1990, abandoned, which is a continuation of Ser. No. 355,795, May 22, 1989, abandoned, which is a continuation of Ser. No. 220,952, Jun. 21, 1988, abandoned, which is a continuation of Ser. No. 769,683, Aug. 27, 1985, abandoned.

[30] Foreign Application Priority Data

Sep. 1, 1984 [JP] Japan .................. 59-183149

[51] Int. Cl.$^5$ .................................. H01L 27/14
[52] U.S. Cl. .................................. 357/30; 357/59; 357/58; 330/253
[58] Field of Search .............. 357/30 P, 30 O, 30 L, 357/30 R, 30 I, 30 E, 59 C, 59 D, 59 E, 58; 330/253

[56] References Cited

U.S. PATENT DOCUMENTS

| | | | |
|---|---|---|---|
| 4,266,237 | 5/1981 | Hendrickson | 357/30 G |
| 4,346,395 | 8/1982 | Ouchi | 357/30 |
| 4,389,534 | 6/1983 | Winterling | 357/30 L |
| 4,488,038 | 12/1984 | Harrison et al. | 357/15 X |
| 4,523,217 | 6/1985 | Jibu | 357/30 G X |
| 4,625,225 | 11/1986 | Goodfellow et al. | 357/30 D |
| 4,636,829 | 1/1987 | Greenwood et al. | 357/30 D |
| 4,651,016 | 3/1987 | Hirao | 357/30 D X |

FOREIGN PATENT DOCUMENTS

| | | | |
|---|---|---|---|
| 59-27104 | 7/1984 | Japan | 357/30 |
| 59-133439 | 7/1984 | Japan | |

OTHER PUBLICATIONS

Sebko et al., "Photoamplifier having Dynamic Compensation of the Temperature Drift of the D-C Component of Photodetectors", Sov. J. Opt. Technol., 46(8), Aug. '79, 486-7.

Schade, "A New Generation of MOS/Bipolar Operational Amplifiers", RCA Review, vol. 37, No. 3, Sep. 1976, pp. 404-424.

Dereniak et al., "Low-Noise Preamplifier for Photoconductive Detectors", Rev. Sci. Instrum., vol. 48, No. 4 (Apr. 1977), pp. 392-394.

Primary Examiner—William Mintel
Attorney, Agent, or Firm—Fitzpatrick, Cella, Harper & Scinto

[57] ABSTRACT

There is a photosensor in which a photoelectric converter having a P-N junction and an amplifying section having a bipolar transistor to amplify an output of this converter are integrally formed in a semiconductor substrate. The input stage of the amplifying section has an insulating gate type transistor, and the output of the photoelectric converter is inputted to the gate electrode of this transistor. The photosensing surface of the photoelectric converter is covered by a transparent protection film, and a thickness of this film is determined so as to make the reflection factor of the incident light at the photosensing surface of the photoelectric converter zero. In the manufacturing of this photosensor, the base region of the bipolar transistor and one region of the P-N junction of the photoelectric converter of the same conductivity type as the base region are simultaneously formed.

7 Claims, 2 Drawing Sheets

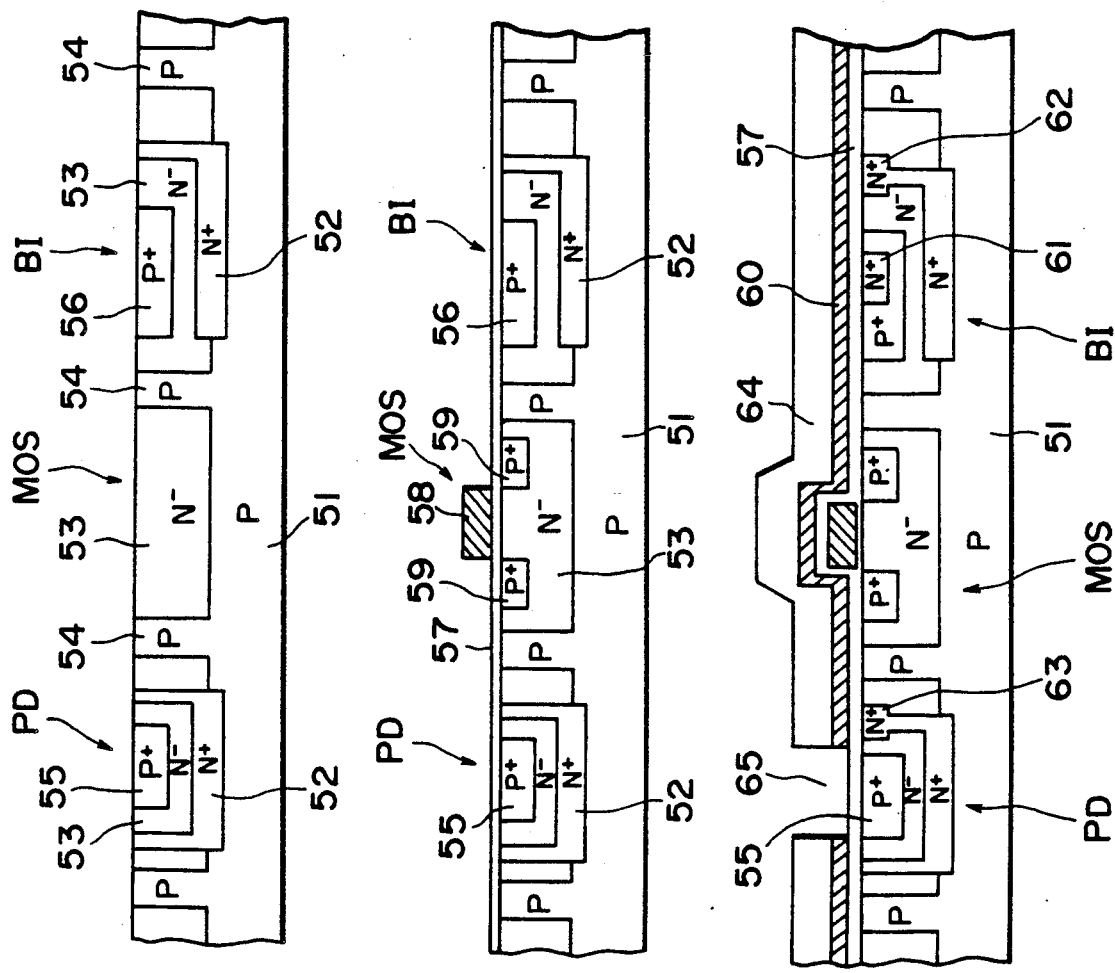

PHOTO SENSOR WITH MONOLITHIC DIFFERENTIAL AMPLIFIER

This application is a continuation of application Ser. No. 07/590.492 filed Oct. 1, 1990, now abandoned, which was a continuation of Ser. No. 07/355,795 filed May 22, 1989, now abandoned, which was continuation of Ser. No. 07/220,952 filed June 21, 1988, now abandoned, which is a continuation of application Ser. No. 06/769,683 filed Aug. 27, 1985, now abandoned.

BACKGROUND OF THE INVENTION

1. Field of the Invention

The present invention relates to a photosensor having a high sensitivity which can be easily manufactured and to a method of manufacturing such a photosensor. The photosensor according to the invention is applied to, for example, a photometric device of cameras, a distance measuring device, or the like.

2. Description of the Prior Art

Photodiodes, phototransistors, or the like are generally used as photoelectric converting elements. However, since the sensitivity which is derived by use of only such a photoelectric converting element is insufficient, the sensitivity is ordinarily improved by connecting an amplifier to this element.

However, conventional photosensor are constituted in such a manner that the photoelectric converting element and amplifier are formed on different substrates and they are connected by way of wirings such as wire bonding. Consequently, a connection leakage current exists between the photoelectric converting element and the amplifier. Therefore, particularly, in the case of low illuminance (less than about $10^{-3}$ luxes) at which a photocurrent which is produced in the photoelectric converting element is very small, the S/N ratio (signal to noise ratio) is degraded.

As a photosensor to solve such a drawback, there has been proposed a photosensor in which a photoelectric converting element and an amplifier are integrally formed (Japanese Patent Examined Publication (Kokoku) No.27104/1984 and U.S. Pat. No. 4,488,038).

However, according to the invention disclosed in the Japanese Patent Examined Publication (Kokoku) No.27,104/1984, the photoelectric converting element is integrally formed with an IIL gate. Therefore, in the case where the photocurrent becomes very small since the illuminance is low, the ratio between an injection current and a signal current becomes large, so that the output signal becomes unstable.

On one hand, according to the invention set forth in U.S. Pat. No. 4,488,038, a transistor of the Schottky barrier type and the like are used, so that special manufacturing processes are needed.

SUMMARY OF THE INVENTION

It is an object of the present invention to provide a photosensor which can solve the above-mentioned conventional problem of the photosensor wherein the sensitivity is degraded and an output becomes unstable when an illuminance is low.

Another object of the invention is to provide a method of manufacturing a photosensor which can solve the problem of the above-mentioned conventional manufacturing method such that special manufacturing processes are needed.

Still another object of the invention is to provide a photosensor which is constituted in such a manner that a photoelectric converting element and an amplifier to amplify an output of this element are integrally formed, and a transistor of the insulated gate type is provided at the input stage of the amplifier, and the output of the photoelectric converting element is inputted to a gate electrode of this transistor.

Still another object of the invention is to provide a method of manufacturing a photosensor in which at least a photoelectric converting section including a P-N junction and an amplifying section consisting of a transistor of the insulated gate type which receives an output of the photoelectric converting section and a bipolar transistor are provided in a substrate of a semiconductor of one conductivity type, characterized in that the base region of the bipolar transistor and one region of the P-N junction of the photoelectric converting section of the same conductivity type as that base region are simultaneously formed.

BRIEF DESCRIPTION OF THE DRAWINGS

FIGS. 2A, 2B and 2C are schematic manufacturing process diagrams showing an embodiment of a method of manufacturing a photosensor according to the invention.

DETAILED DESCRIPTION OF THE PREFERRED EMBODIMENT

Figure 1:
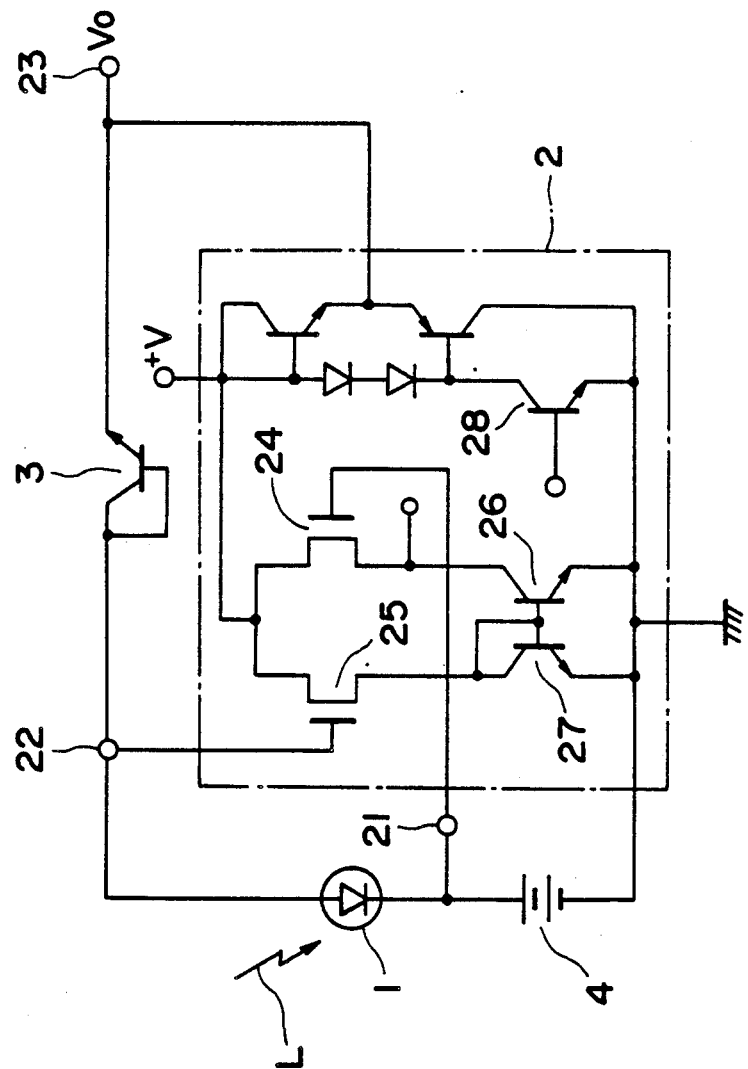
FIG. 1 is a circuit diagram of an embodiment of a photosensor according to the present invention.

An embodiment of the present invention will be described in detail hereinbelow with reference to the drawings. FIG. 1 is a circuit diagram of an embodiment of a photosensor according to the invention.

In this diagram, both terminals of a photodiode 1 are respectively connected to input terminals 21 and 22 of an operational amplifier 2. A transistor 3 for logarithm transformation is connected to the input terminal 22 and an output terminal 23 of the operational amplifier 2. A power supply 4 is also connected to the input terminal 21.

In the operational amplifier 2, the input terminals 21 and 22 are respectively connected to gates of MOS transistors 24 and 25. The MOS transistors 24 and 25 and bipolar transistors 26 and 27 constitute a differential amplifier circuit of the Bi-MOS type and serve as an input stage of the operational amplifier 2. The foregoing circuits are monolithically formed to reduce, to the lowest level possible a connection current leakage.

In this embodiment with such an arrangement, when a light L enters the photodiode 1, a photo current corresponding to the intensity of incident light L flows through the photodiode 1. This photocurrent is logarithm-compressed by a logarithm transforming circuit consisting of the operational amplifier 2 and transistor 3 and is outputted as an output voltage $V_0$ from the output terminal 23.

Since the input stage is constituted by the MOS transistors 24 and 25 as mentioned above, even in the case where the photocurrent which is allowed to flow when the light L of $10^{-3}$ luxes enters is so small to be about $10^{-12}$ amperes, it is imputted as a high impedance current with less current leakage, so that the stable output having a good S/N ratio can be derived.

FIGS. 2A to 2C are schematic manufacturing process diagrams showing an embodiment of a method of manufacturing a photosensor according to the present invention.

In FIG. 2A, N+ buried layers 52, N− epitaxial layers 53, and P regions 54 for separation of elements are first formed in a P-type silicon substrate 51. In this diagram, there are shown a photodiode region PD (corresponding to the photodiode 1 in FIG. 1), a MOS transistor region MOS (corresponding to the MOS transistors 24 and 25 in FIG. 1), and a bipolar region BI (corresponding to the bipolar transistors 26, 27, 28, etc. in FIG. 1).

Subsequently, p-type impurities such as boron or the like are simultaneously diffused in each N− epitaxial layer 53 of the regions PD and BI thereby to simultaneously form a P+ region 55 of the P-N junction of the photodiode and a base region 56 of the NPN bipolar transistor. However, the depth of P+ region 55 determines the spectral sensitivity characteristic of the photodiode and the depth of the base region 56 exerts an influence on the characteristic of the bipolar transistor; therefore, it is necessary to form the P+ diffusion regions 55 and 56 in consideration of both of those characteristics.

Next, as shown in FIG. 2B, an oxide film 57 for a MOS gate is formed and a polysilicon gate 58 is formed on the oxide film 57. Subsequently, P-type impurity ions are implanted using the gate 58 as a mask and P+ regions 59 serving as a source and a drain are formed by way of thermal diffusion.

Then, as shown in FIG. 2C, the oxide film 57 on the region PD is further oxidized until it becomes a predetermined thickness. The oxide film 57, by having a significant thickness, serves to prevent the light reflection as mentioned above.

After the oxide film 57 was formed to have the predetermined thickness, a silicon nitride (Si₃N₄) film 60 is formed thereon. The oxide film 57 is protected from the etchant or the like by the silicon nitride film 60, and at the same time the entering of ions into each semiconductor element, which could cause a defect of the photosensor, is prevented.

Subsequently, an emitter region 61 and an ohmic contact region 62 of a collector are formed in the region BI and an ohmic contact region 63 is formed in the region PD by way of implantation and diffusion of N-type impurity ions of phosphorus or the like. Aluminum wirings are formed to constitute the circuit shown in FIG. 1 and then a protection film 64 (insulating film between layers, light shielding metal film, and passivation film etc.) is formed.

The protection film 64 on the photosensing surface of the region PD is removed due to etching. Subsequently, the silicon nitride film 60 is removed by way of plasma etching for allowing the oxide film 57 to be exposed, and thereby forming a photosensing section 65.

The gas of CF₄+O₂ (4%) is used as a plasma etching gas. Since this gas has a selection ratio of about 7 between silicon nitride and silicon oxide, only the silicon nitride film 60 can be removed with hardly etching the oxide film 57.

In this manner, by using a film with a relatively higher etching selection ratio as compared to the oxide film 57 as a protective film for the oxide film 57, it is possible to safely protect the oxide film 57 for prevention of reflection which requires a high very precise thickness.

The thickness of the oxide film 57 is decided in the following manner.

Assuming that the refractive index of the medium (in this case, air) in the outside of the oxide film 57 is $n_0$, the refractive index of the oxide film 57 is $n_1$, and the refractive index of the medium (in this case, silicon) in the inside of the oxide film 57 is $n_2$, the reflection factor R at the surface of the P+ region 55 of the photodiode region PD is obtained by the following equations:

$$R = \frac{r_1 + r_2 \exp(i\delta)}{1 + r_1 r_2 \exp(i\delta)}$$

where, $$r_1 = \frac{n_0 - n_1}{n_0 + n_1}$$

$$r_2 = \frac{n_1 - n_2}{n_1 + n_2}$$

$$\delta = \frac{2\pi}{\lambda}(2n_1 d_1)$$

$\lambda$ is a wavelength of the incident light and
$d_1$ is a thickness of the oxide film 57.

The value of $d_1$ which makes the reflection factor R zero is obtained from the above equations and the thickness of the oxide film 57 is controlled so as to become $d_1$. Due to this, the photodiode having a high sensitivity can be manufactured without losing the light at the surface of the diode.

As described in detail in the above, according to the photosensor of the invention, the input impedance becomes extremely high and the leakage current is small, so that even in case of a very small photocurrent, it can be stably detected with a good S/N ratio.

On one hand, according to the method of manufacturing the photosensor of the invention, the above-mentioned photosensor with high characteristic can be manufactured using general integrated circuit manufacturing processes. In particular, the processes to form the semiconductor region and oxide film which require the control in the direction of depth can be simplified. Further, the base region of the bipolar transistor and the photosensitive region of the photoelectric converting section of the same conductivity type as the base region are simultaneously formed, and the transparent protection film of the photoelectric converting section and the protection films of other transistors are simultaneously formed, so that the manufacturing processes are simplified.

We claim:
1. A photosensor comprising:
a light sensor including a photodiode for producing an output in response to light incident thereon, said photodiode comprising a first semiconductor region formed of a first conductivity type, a second semiconductor region formed of a second conductivity type, and a third semiconductor region formed of said second conductivity type and having a higher concentration than said second semiconductor region; and
a differential amplifier for differentially amplifying the output of said photodiode, said amplifier having an input stage comprising at least one insulated gate transistor for amplifying the output of said photodiode, and at least one bipolar transistor for amplifying the output of said input stage, said bipolar transistor having a base formed by a fourth semiconductor region of the first conductivity type, a fifth semiconductor region formed of the second conductivity type, a collector formed by a sixth semiconductor region of the second conductivity type, said sixth semiconductor region having a higher impurity concentration than said fifth semiconductor region, and an emitter region formed by a seventh semiconductor region of the second conductivity type;

wherein said photodiode and said bipolar transistor are formed on a semiconductor substrate of said first conductivity type, and wherein said photodiode, said insulated gate transistor and said bipolar transistor are monolithically formed side-by-side on a semiconductor substrate.

2. A photosensor according to claim 1, further comprising:

a transparent protective film covering a photosensing surface of said photodiode, wherein a thickness of said transparent protective film is determined so as to make a reflection factor of incident light at said photosensing surface substantially zero.

3. A photosensor according to claim 1, wherein said photodiode, said insulated gate transistor, and said bipolar transistor are arranged both substantially in a row on the substrate and sequentially in order of said photodiode, said insulated gate transistor, and said bipolar transistor.

4. A photosensor comprising:

a photoelectric converting elements including a photodiode having an anode and a cathode, said photodiode for producing an output in response to light incident thereon, said photodiode comprising a first semiconductor region of a first conductivity type, and second and third semiconductor regions of a second, different, conductivity type, said third region with a higher impurity concentration than said second region; and a differential amplifier for differentially amplifying the output of said photodiode, said amplifier including an input stage comprising first and second insulated gate transistors for amplifying the output of said photodiode, said first insulated gate transistor having a gate electrode connected to the anode of said photodiode and said second insulated gate transistor having a gate electrode connected to the cathode of said photodiode, said amplifier further including at least one bipolar transistor for amplifying the output of said input stage, said bipolar transistor comprising a base formed by a fourth semiconductor region of the first conductivity type, a fifth semiconductor region formed of the second conductivity type, a collector formed by a sixth semiconductor region of the second conductivity type, said sixth semiconductor region having a higher impurity concentration than said fifth semiconductor region, and an emitter formed by a seventh semiconductor region of the second conductivity type;

wherein said photodiode and said bipolar transistor are formed on a semiconductor substrate of said first conductivity type, and wherein said photodiode, said first and second insulated gate transistors and said bipolar transistor are monolithically formed side-by-side on a semiconductor substrate.

5. A photosensor according to claim 4, wherein said photodiode, one of said first and second insulated gate transistors, and said bipolar transistor are arranged both substantially in a row on the substrate and sequentially in order of said photodiode, said one of said first and second insulated gate transistors, and said bipolar transistor.

6. A photosensor according to claim 4, further comprising:

a silicon oxide film formed on said photodiode, insulated gate transistor and bipolar transitor, and having a thickness at a photosensing section selected so that a reflection factor at the boundary between said photodiode and said film is about zero.

7. A photosensor according to claim 4, further comprising:

a silicon oxide film formed on said photodiode, insulated gate transistors and bipolar transistor, and having a thickness at a photosensing section selected so that a reflection factor at the boundary between said photodiode and said film is about zero.

* * * * *

UNITED STATES PATENT AND TRADEMARK OFFICE
CERTIFICATE OF CORRECTION

PATENT NO. : 5,101,253
DATED : March 31, 1992
INVENTOR(S) : Mizutani et al.

It is certified that error appears in the above-identified patent and that said Letters Patent is hereby corrected as shown below:

On the title page, item

[56] REFERENCES CITED:

"59-27104 7/1984 Japan" should read --59-27104 2/1984 Japan--.

COLUMN 1:

Line 28, "photosensor" should read --photosensors--.

COLUMN 2:

Line 51, "possible" should read --possible,--.

COLUMN 3:

Line 65, "high" should be deleted.

COLUMN 4:

Line 37, "with high characteristic" should be deleted.
  Line 59, "higher" should read --higher impurity--.

UNITED STATES PATENT AND TRADEMARK OFFICE
CERTIFICATE OF CORRECTION

PATENT NO. : 5,101,253
DATED : March 31, 1992
INVENTOR(S) : Mizutani et al.

It is certified that error appears in the above-identified patent and that said Letters Patent is hereby corrected as shown below:

COLUMN 5:

Line 15, "claim 1," should read --claim 1 or 4,--.
Line 29, "elements" should read --element--.

Signed and Sealed this

Fifth Day of October, 1993

BRUCE LEHMAN

*Attest:*

*Attesting Officer*

*Commissioner of Patents and Trademarks*